United States Patent
Chang

(10) Patent No.: US 11,152,456 B2
(45) Date of Patent: Oct. 19, 2021

(54) FERROELECTRIC TUNNEL JUNCTION WITH INTERNAL GATE

(71) Applicant: Taiwan Semiconductor Manufacturing Company, Ltd., Hsinchu (TW)

(72) Inventor: Chih-Sheng Chang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 6 days.

(21) Appl. No.: 16/671,502

(22) Filed: Nov. 1, 2019

(65) Prior Publication Data

US 2021/0066448 A1 Mar. 4, 2021

Related U.S. Application Data

(60) Provisional application No. 62/894,161, filed on Aug. 30, 2019.

(51) Int. Cl.
*H01L 49/02* (2006.01)
*H01L 27/11507* (2017.01)

(52) U.S. Cl.
CPC ........ *H01L 28/60* (2013.01); *H01L 27/11507* (2013.01)

(58) Field of Classification Search
CPC ..................... H01L 28/60; H01L 27/11507
See application file for complete search history.

(56) References Cited

PUBLICATIONS

Masaharu Kobayashi, et al., "Ferroelectric HfO2 Tunnel Junction Memory With High TER and Multi-Level Operation Featuring Metal Replacement Process," Journal of the Electron Devices Society, vol. 7, 2019, 6 pages.

*Primary Examiner* — Robert G Bachner
(74) *Attorney, Agent, or Firm* — Slater Matsil, LLP

(57) ABSTRACT

A device includes a bottom electrode that includes a first electrically conducive material; a dielectric layer over the bottom electrode; an internal metal layer over the dielectric layer; a ferroelectric layer over the internal metal layer; and a top electrode over the ferroelectric layer, the top electrode including a second electrically conductive material, an area of the top electrode being smaller than an area of the internal metal layer.

20 Claims, 6 Drawing Sheets

FERROELECTRIC TUNNEL JUNCTION WITH INTERNAL GATE

CROSS-REFERENCE AND PRIORITY CLAIMS

This application claims the benefit of U.S. Provisional Application No. 62/894,161, filed on Aug. 30, 2019 and entitled "Ferroelectric Tunneling Junction with Internal Gate as Nonvolatile Memory," which application is hereby incorporated herein by reference.

TECHNICAL FIELD

The present invention relates generally to ferroelectric tunnel junctions (FTJs), and, in particular embodiments, to ferroelectric tunnel junctions having an internal metal gate and non-volatile memory devices formed with such ferroelectric tunnel junctions.

BACKGROUND

A conventional ferroelectric tunnel junction (FTJ) is a tunnel junction which includes two metal electrodes that are separated by a thin ferroelectric layer. The direction (also referred to as orientation) of electrical polarization of the ferroelectric layer can be switched by an electric field applied. The electrical resistance of the FTJ, also referred to as the tunneling electroresistance (TER) of the FTJ, is determined by the orientation of the electric polarization of the ferroelectric layer. For example, by changing the electrostatic potential (e.g., voltage) profile across the ferroelectric barrier, the FTJ may change from a high-resistance state (HRS) to a low-resistance state (LRS), or vice versa. Denote the TER in high-resistance state as $R_{HRS}$, and denote the TER in low-resistance state as $R_{LRS}$, the TER ratio of an FTJ is defined as $R_{HRS}/R_{HRS}-1$. Generally, a high TER ratio is advantageous for FTJs used in memory devices. The tunneling current of the FTJ, which is inverse proportional to the programmable TER of the FTJ, may be used to represent different states (e.g., "0" or "1") of the memory device.

Due to the ability to program (e.g., set) the tunneling electroresistance of the FTJ with different voltages, there has been increased interest in FTJ-based non-volatile memory devices. However, there are many challenges in forming FTJs suitable for memory devices. For example, the endurance of a FTJ may be poor due to the breakdown of certain dielectric layer in the FTJ. There is a need in the art for forming high performance (e.g., high endurance, high TER ratio, low programming voltage, small area) FTJs suitable for memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1A:
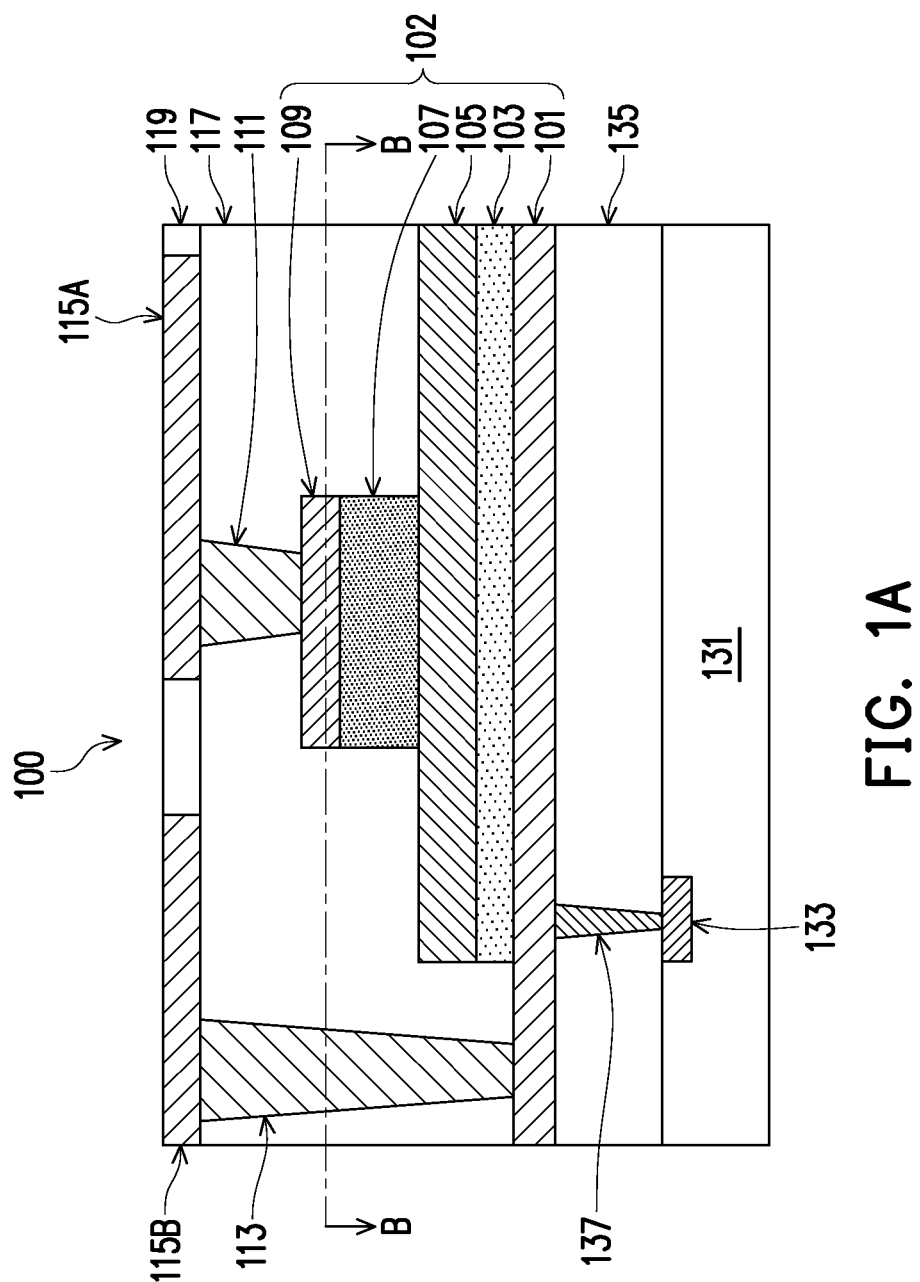
FIGS. 1A and 1B illustrate cross-sectional views of a device comprising a ferroelectric tunnel junction (FTJ), in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Throughout the description herein, unless otherwise specified, the same reference numeral in different figures refers to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a ferroelectric tunnel junction (FTJ) includes a bottom electrode, a dielectric layer over the bottom electrode, an internal metal layer over the dielectric layer, a ferroelectric film over the internal metal layer, and a top electrode over the ferroelectric film. In some embodiments, the top electrode and the ferroelectric film have a first surface area, and the internal metal layer and the dielectric layer have a second surface area, where the first surface area is smaller than the second surface area. The bottom electrode may be a metal layer, a metal-containing layer, or a heavily doped semiconductor layer. The bottom electrode may be a planar layer, or may have a fin structure. The dielectric layer of the FTJ may be formed of a high-K dielectric material. The disclosed FTJs may be used to form non-volatile memory devices. The disclosed structures of the various embodiment FTJs advantageously reduce or avoid the breakdown of the dielectric layer of the FTJs, thus improving the endurance of the IFTJs.

Figure 1B:
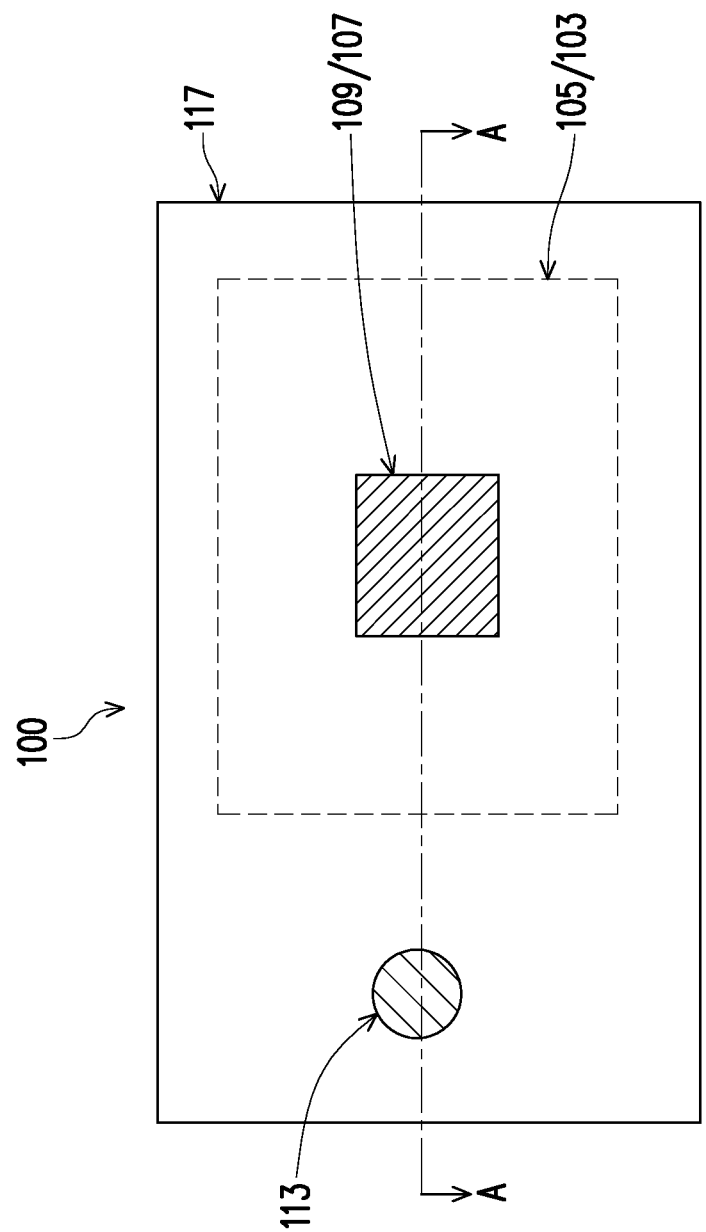

FIGS. 1A and 1B illustrate cross-sectional views of a device 100 comprising a ferroelectric tunnel junction (FTJ) 102, in an embodiment. FIG. 1B illustrates the cross-sectional view of the device 100 along cross-section B-B in FIG. 1A, and FIG. 1A illustrates the cross-sectional view of the device 100 along cross-section A-A in FIG. 1B. Note that for clarity, not all features of the device 100 are illustrated in FIGS. 1A and 1B, and FIGS. 1A and 1B may illustrate only a portion of the device formed. In addition, to illustrate the relationship (e.g., locations, sizes) between different features of the device 100, some features (e.g., 105, 103) that are not visible along the cross-section B-B are also illustrated in FIG. 1B in dashed lines.

Referring to FIG. 1A, the device 100 includes a substrate 131, a dielectric layer 135 over the substrate 131, a ferroelectric tunnel junction 102 (FTJ) over the dielectric layer 135, dielectric layers 117 and 119 over the dielectric layer 135, vias 111/113, and conductive lines 115A/115B. The FTJ 102 includes a bottom electrode 101 (also referred to as a bottom metal layer), a dielectric layer 103, an internal metal layer 105 (also referred to as an internal gate), a ferroelectric layer 107 (also referred to as a ferroelectric film), and a top electrode 109 (also referred to as a top metal layer).

FIG. 1A further illustrates a conductive feature 133 formed in or on the substrate 131. In the illustrated embodiment, the conductive feature 133 is a transistor that is electrically coupled to the bottom electrode 101 of the FTJ 102 by a via 137. In the example of FIG. 1A, the via 137 extends through the dielectric layer 135 and electrically couples the bottom electrode 101 to a drain of the transistor 133. The device 100 may therefore be a memory cell of a memory device (e.g., a non-volatile memory device) with a 1T1FTJ structure, where T stands for transistor, and FTJ stands for ferroelectric tunnel junction. Details of the device 100 and method of forming the device 100 are discussed hereinafter.

The substrate 131 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors 133, diodes, capacitors, resistors, etc., may be formed in and/or on the substrate 131 and may be interconnected by interconnect structures formed by, for example, metallization patterns in one or more dielectric layers over the substrate 131. FIG. 1A only illustrates a portion of the device that includes the FTJ 102 and the transistor 133.

The dielectric layer 135, which may be an interlayer dielectric (ILD) layer, is formed over the substrate 131. The dielectric layer 135 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, chemical vapor deposition (CVD), or the like. Next, the via 137 is formed in the dielectric layer 135 to electrically couple to, e.g., a drain of the transistor 133. The via 137 may be formed by forming an opening in the dielectric layer 135 and filling the opening with an electrically conductive material (e.g., copper, tungsten, or the like).

Next, the bottom electrode 101 is formed over the dielectric layer 135. The bottom electrode 101 is formed of an electrically conductive material. In the example of FIG. 1A, the bottom electrode 101 is formed of a metal or a metal-containing material, such as copper (Cu), tungsten (W), platinum (Pt), titanium nitride (TiN), tantalum nitride (TaN), or the like. A thickness of the bottom electrode 101 may be between about 5 nm and about 30 nm, as an example. A suitable formation method, such as atomic layer deposition (ALD), may be used to form the bottom electrode 101.

Next, the dielectric layer 103 and the internal metal layer 105 are formed over the bottom electrode 101, successively. The dielectric layer 103 is a silicon oxide layer, in some embodiments. In some embodiments, the dielectric layer 103 is formed of a high-K dielectric material having a dielectric constant (K) value larger than 3.9, such as between about 3.9 and about 25. Examples of the high-K dielectric material include hafnium oxide (e.g., $HfO_2$), zirconium oxide (e.g., $ZrO_2$), silicon nitride (e.g., SiN), and lanthanum oxide (e.g., $La_2O_3$). A thickness of the dielectric layer 103 is less than about 2 nm, such as about 1 nm, in some embodiments. A suitable deposition method, such as ALD, may be used to form the dielectric layer 103.

The internal metal layer 105 is formed of an electrically conductive material (e.g., Cu, W, Pt, TiN, TaN), and may be formed of a same material as the bottom electrode 101. A suitable deposition method, such as ALD, may be used to form the internal metal layer 105. A thickness of the internal metal layer 105 is between about 5 nm and about 30 nm, in some embodiments.

Next, the dielectric layer 103 and the internal metal layer 105 are patterned using, e.g., a same patterning mask. In other words, a single patterning process is used to pattern both the dielectric layer 103 and the internal metal layer 105, in some embodiments. An anisotropic etching process, such as a plasma etching process, may be used to pattern the dielectric layer 103 and the internal metal layer 105. The patterning process removes portions of the dielectric layer 103 and portions of the internal metal layer 105, and exposes portions of the bottom electrode 101. After the patterning process, remaining portions of the dielectric layer 103 and remaining portions of the internal metal layer 105 have a same size (e.g., same length, width, and surface area), as illustrated in FIGS. 1A and 1B. For example, as shown in FIG. 1B, the internal metal layer 105 and the dielectric layer 103 have a same surface area in a top view, thus their boundaries (e.g., sidewalls) overlap completely.

Referring back to FIG. 1A, after the dielectric layer 103 and the internal metal layer 105 are patterned, the ferroelectric layer 107 and the top electrode 109 are formed successively over the internal metal layer 105. The ferroelectric layer 107 is formed of a suitable ferroelectric material, such as doped hafnium oxide. The doped hafnium oxide may be a hafnium oxide doped by silicon (Si), zirconium (Zr), aluminum (Al), or lanthanum (La). For example, the doped hafnium oxide may be a hafnium oxide doped with zirconium, where the atomic percentage ratio between Hf, Zr, and O is about 1:1:4. As another example, the doped hafnium oxide may be a hafnium oxide doped with aluminum, where the atomic percentage (at %) of aluminum is less than about 10 at %, such as about 10 at %. The ferroelectric layer 107 may have a thickness between about 1 nm to about 3 nm, such as about 3 nm. A suitable deposition method, such as ALD, may be used to form the ferroelectric layer 107.

The top electrode 109 is formed of an electrically conductive material, such as Cu, W, Pt, TiN, TaN, or the like, and may be formed of a same material as the bottom electrode 101. In some embodiments, the top electrode 109 is formed of a different material than the bottom electrode 101. A thickness of the top electrode 109 is between about 10 nm and about 30 nm, in some embodiments. A suitable deposition method, such as ALD, may be used to form the top electrode 109.

After the top electrode 109 and the ferroelectric layer 107 are formed, the top electrode 109 and the ferroelectric layer 107 are patterned using, e.g., a same patterning mask. In other words, a single patterning process is used to pattern both the top electrode 109 and the ferroelectric layer 107, in some embodiments. An anisotropic etching process, such as a plasma etching process, may be used to pattern the top electrode 109 and the ferroelectric layer 107. The patterning process removes portions of the top electrode 109 and portions of the ferroelectric layer 107, and exposes portions of the internal metal layer 105. After the patterning processing, remaining portions of the top electrode 109 and remaining portions of the ferroelectric layer 107 have a same size (e.g., same length, width, and surface area), as illustrated in FIGS. 1A and 1B. For example, as shown in FIG. 1B, the top electrode 109 and the ferroelectric layer 107 have a same surface area in the top view, thus their boundaries (e.g., sidewalls) overlap completely.

As illustrated in FIG. 1B, an area $A_1$ (may also be referred to as a surface area, or a top surface area) of the top electrode 109 is smaller than an area $A_2$ (may also be referred to as a surface area, or a top surface area) of the internal metal layer 105. In the example of FIG. 1B, the areas $A_1$ and $A_2$ are rectangular areas, and therefore, the areas $A_1$ and $A_2$ may be computed by multiplying a width and a length of the rectangle area of the respective layer (e.g., 109, 105) illustrated in FIG. 1B. In some embodiments, a ratio between the area $A_1$ of the top electrode 109 and the area $A_2$ of the internal metal layer 105 is between about 1/100 and about 1/5, such as about 1/30. In the discussion herein, the top electrode 109, the ferroelectric layer 107 and the internal metal layer 105 may be referred to as a first capacitor, where the top electrode 109 and the internal metal layer 105 are considered as the plates (e.g., top plate and bottom plate, respectively) of the first capacitor, and the ferroelectric layer 107 is considered as the dielectric layer between the plates of the first capacitor. The area (e.g., plate area) of the first capacitor is determined by the area of the top electrode 109, and therefore, is $A_1$. The top electrode 109, the ferroelectric layer 107, and the internal metal layer 105 may be collectively referred to as an MFM structure or an MFM capacitor, where M stands for the metal material (e.g., of layer 109 or layer 105), and F stands for the ferroelectric material (e.g., of layer 107).

Similarly, the internal metal layer 105, the dielectric layer 103, and the bottom electrode 101 may be referred to as a second capacitor, and the area (e.g., plate area) of the second capacitor is determined by the area of the internal metal layer 105, and therefore, is $A_2$. The internal metal layer 105, the dielectric layer 103, and the bottom electrode 101 may be collectively referred to as an MIM structure or an MIM capacitor, where M stands for metal material (e.g., of layer 105 or layer 1*i*), and I stands for dielectric material (e.g., of layer 103). The FTJ 102 of FIG. 1A, therefore, may be referred to as an MFMIM FTJ or an MFMIM structure. The FTJ 102 is a two-terminal device, with the bottom electrode 101 and the top electrode 109 functioning as the two terminals of the FTJ 102.

Still referring to FIG. 1A, next, a dielectric layer 117, such as SiO2, SiN, a low-K dielectric material, or the like, is formed over the bottom electrode 101 and over the FTJ 102. A suitable deposition method, such as CVD, PVD, or the like, may be used to form the dielectric layer 117. A via 11 is formed to extend from an upper surface of the dielectric layer 117 into the dielectric layer 117, and to electrically couple to the top electrode 109. Another via 113 is formed to extend from the upper surface of the dielectric layer 117 into the dielectric layer 117, and to electrically couple to the bottom electrode 101.

Next, a dielectric layer 119 is formed over the dielectric layer 117, and conductive lines 115A and 115B (e.g., copper lines) are formed in the dielectric layer 119. The dielectric layer 119 may comprise a same or similar material as the dielectric layer 117, and may be formed using a same or similar formation method, thus details are not repeated. The conductive lines 115A and 115B may be formed using any suitable method, such as a damascene process. In some embodiments, the conductive lines 115A/115B and the vias 111/113 are formed together in a dual-damascene process, in which case the dielectric layers 117 and 119 may be formed together as one layer. In the example of FIG. 1A, the conductive lines 115A and 115B are electrically coupled to the vias 111 and 113, respectively. The conductive lines 115A and 115B provide electrical connection to the two terminals (e.g., top electrode 109 and bottom electrode 101) of the FTJ 102. In some embodiments, since the bottom electrode 101 of the FTJ 102 is electrically coupled to, e.g., the drain of the transistor 133 through the via 137 (see FIG. 1A), and therefore, the via 113 and the conductive line 115B may be omitted.

Additional processing, such as formation of additional dielectric layers and conductive features (e.g., vias, conductive lines) may be performed to finish fabrication of the device 100, as one skilled in the art readily appreciates, thus details are not discussed herein. In addition, for clarity, not all features of the device 100 are illustrated in FIGS. 1A and 1B. For example, electrical connections to the gate and the source of the transistor 133, as well as other components (e.g., other transistors, resistors, diodes, capacitors, inductors, or the like) of the device 100 and their electrical connections, are not illustrated in FIGS. 1A and 1B.

The rectangular shapes of the various layers (e.g., 109, 107, 105, 103) of the FTJ 102 illustrated in FIG. 1B are non-limiting examples. Other shapes, such as square, circle, polygon, or the like, are also possible and are full intended to be included within the scope of the present disclosure.

The disclosed structure of the FTJ 102 (and other FTJs disclosed hereinafter) has many advantages. To appreciate the advantages, consider a reference FTJ which is similar to the FTJ 102 in FIG. 1A, but without the internal metal layer 105. In addition, the reference FTJ has a same size (e.g., same surface area in top view) for the top electrode 109, the ferroelectric layers 107, and the dielectric layer 103. Since a typical electric displacement field (D field) for a ferroelectric layer (e.g., 107) is about 30 μC/cm², and since the structure of the reference FTJ results in a similar D field in the dielectric layer (e.g., 103), such a D field may induced an electrical field (E field) much higher than about 10 MV/cm which may cause breakdown of the dielectric layer. The breakdown of the dielectric layer in the FTJ may contribute to the poor endurance of certain FTJs.

In the disclosed embodiments, by having the internal metal layer 105, and by designing the area $A_1$ of the top electrode 109 to be smaller than the area $A_2$ of the internal metal layer 105, together with the other disclosed features, the breakdown of the dielectric layer 103 is alleviated or avoided (see discussion below), thus the endurance of the FTJ is improved.

With the internal metal layer 105 inserted between the top electrode 109 and the bottom electrode 101, the FTJ 102 may be considered as two capacitors coupled in series, where the two capacitors are: a first capacitor (e.g., an MFM capacitor) comprising the top electrode 109, the ferroelectric layer 107, and the internal metal layer 105, and a second capacitor (e.g., an MIM capacitor) comprising the internal metal layer 105, the dielectric layer 103, and the bottom electrode 101. Since the first capacitor and the second capacitor are coupled in series, one skilled in the art will readily appreciate that due to charge conservation, the D field in the dielectric layer 103 is equal to the D filed in the ferroelectric layer 107 multiplied by a factor of $A_1/A_2$. Since the factor of $A_1/A_2$ is smaller than one (e.g., between 1/100 and 1/5, such as 1/30), compared with the D field in the ferroelectric layer 107, the D field in the dielectric layer 103 is reduced. The reduced D filed in the dielectric layer 103 reduces or prevents the breakdown of the dielectric layer 103.

In addition, one skilled in the art will readily appreciate that since the ferroelectric layer 107 has pre-determined programming voltages (e.g., voltages to change its electrical polarization direction), and since the first capacitor shoulders a larger percentage of a voltage V applied across the FTJ 102 between the top electrode 109 and the bottom electrode 101 (due to the ratio $A_1/A_2$ being smaller than one), a smaller voltage V applied across the FTJ 102 may be sufficient to provide the pre-determined programming voltages for the ferroelectric layer 107, e.g., compared with a reference design where the first capacitor and the second capacitor have a same area (e.g., same surface area in the view of FIG. 1B). In other words, the disclosed embodiments allow for lower programming voltages V for the FTJ 102. The lower programming voltage V may advantageously reduce the power consumption of the FTJ 102 and/or the memory device formed using the FTJ 102.

The use of high-K dielectric material as the dielectric layer 103 further improves the performance of the FTJ 102. This is because for the same D field, the electrical field (E-field) in the dielectric layer 103 is inversely proportional to the K value of the dielectric layer 103. Therefore, a higher K value (due to the use of high-K dielectric material) results in a reduced E-field in the dielectric layer 103, which helps to prevent or reduce the breakdown of the dielectric layer 103. Note that a higher K value may result in a lower breakdown E-field for the dielectric layer 103. However, as long as the reduction in the E-field due to the use of high-K dielectric material is larger than the reduction in the breakdown E-field, using high-K dielectric material for the dielectric layer 103 provides performance gain (e.g., reduces breakdown of the dielectric layer 103).

Figure 2:
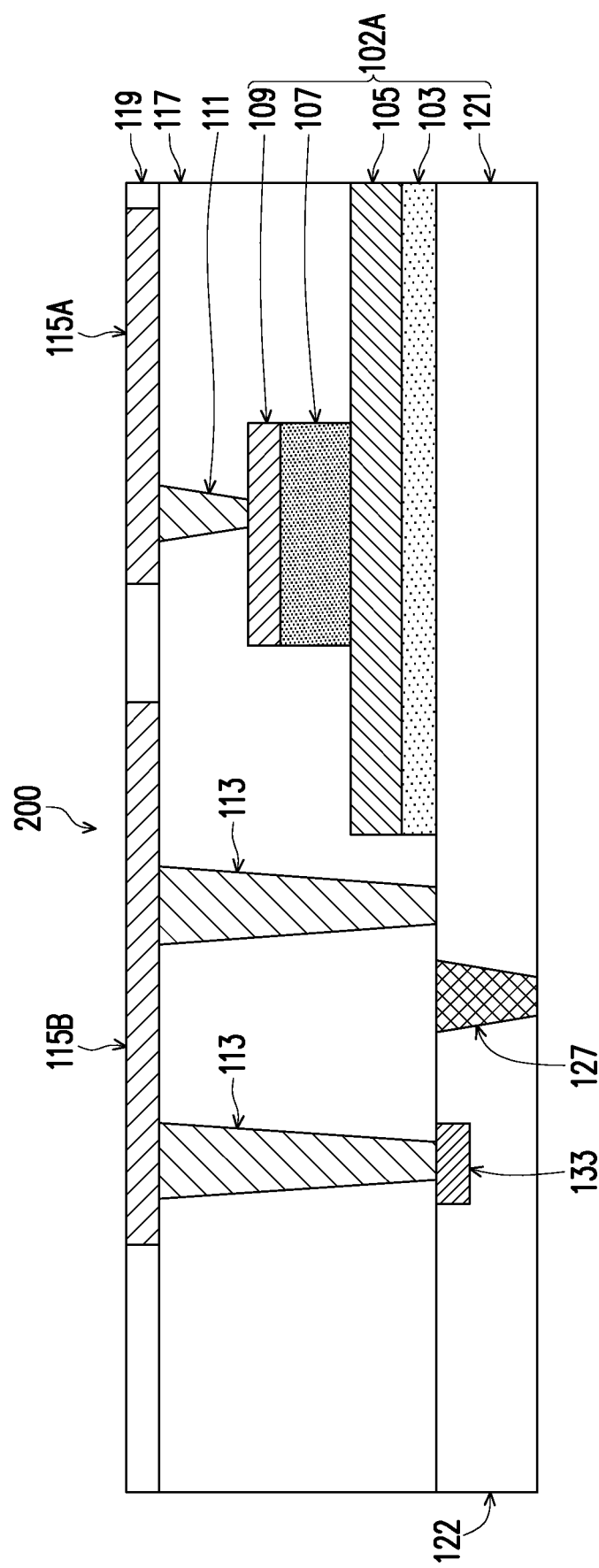
FIG. 2 illustrates a cross-sectional view of a device comprising an FTJ, in another embodiment.

FIG. 2 illustrates a cross-sectional view of a device 200 (e.g., a memory device) comprising an FTJ 102A, in an embodiment. For simplicity, not all features of the device 200 are illustrated. The FTJ 102A in FIG. 2 is similar to the FTJ 102 in FIG. 1A, but the bottom electrode of the FTJ 102A is a heavily doped substrate 121 instead of the metal or metal-containing material in FIG. 1A. In some embodiments, the heavily doped substrate 121 is a semiconductor substrate (e.g., silicon, silicon-germanium, germanium, or the like) doped by a dopant (e.g., boron, phosphorous, or arsenic). A concentration of the dopant may be between about $10^{19}$ cm$^{-3}$ and about $10^{21}$ cm$^{-3}$, as an example. Due to the dopant in the heavily doped substrate 121, the heavily doped substrate 121 is electrically conductive, in the illustrated embodiment. For example, an electrical resistivity of the heavily doped substrate 121 is between 0.1 mΩ·cm and about 10 mΩ·cm. A thickness of the heavily doped substrate 121 is between about 100 nm and about 100 m, in an embodiment. In some embodiments, the heavily doped substrate 121 is a doped semiconductor layer over another substrate, or a doped top portion of a substrate.

FIG. 2 further illustrates an isolation region 127, such as a shallow trench isolation (STI) region, which separates the bottom electrode 121 from an active region 122 of the substrate. In addition, FIG. 2 illustrates a transistor 133 formed in the active region 122. The vias 113 and the conductive line 115B electrically couples the bottom electrode 121 of the FTJ 102A with the transistor 133. For example, the via 113 over the transistor 133 is electrically coupled to a drain of the transistor 133. Therefore, FIG. 2 illustrates portions of memory device (e.g., a memory cell) with a 1T1FTJ structure. The electrical connection between the transistor 133 and the FTJ 102A shown in FIG. 2 is merely an example, other electrical connections are also possible and are fully intended to be included within the scope of the present disclosure.

In FIG. 2, the top electrode 109, the ferroelectric layer 107 and the internal metal layer 105 form an MFM structure. The internal metal layer 105, the dielectric layer 103, and the heavily doped substrate 121 form an MIS structure, where M stands for metal, I stands for dielectric material, and S stands for substrate. The FTJ 102A may also be referred to as an MFMIS structure or an MFMIS FTJ.

Similar to the FTJ 102, the area $A_1$ of the top electrode 109 of the FTJ 102A is smaller than the area $A_2$ of the internal metal layer 105 of the FTJ 102A. In some embodiments, a ratio between the area $A_1$ and the area $A_2$ is between about 1/100 and about 1/5, such as about 1/30. Dimensions of other layers of the FTJ 102A are the same as or similar to those of the FTJ 102. Fore example, a thickness of the dielectric layer 103 in FIG. 2 is less than about 2 nm, such as 1 nm. A thickness of the ferroelectric layer 107 in FIG. 2 is between about 1 nm and about 3 nm, such as about 3 nm.

Figure 3:
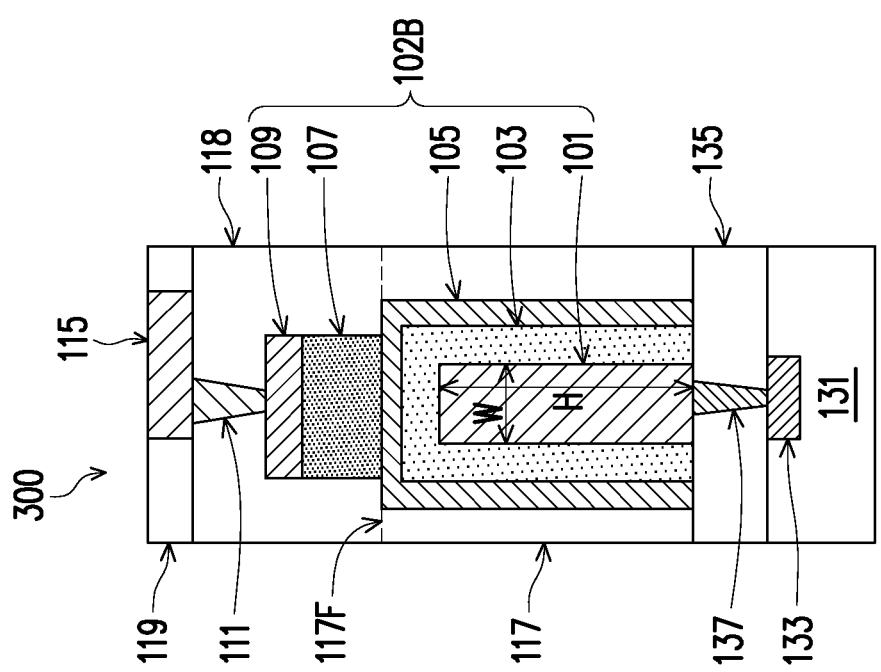
FIG. 3 illustrates a cross-sectional view of a device comprising an FTJ, in another embodiment.

FIG. 3 illustrates a cross-sectional view of a device 300 (e.g., a memory device) with an FTJ 102B, in an embodiment. The FTJ 102B is similar to the FTJ 102, but the second capacitor has a three-dimensional (3D) MIM structure. In particular, the bottom electrode 101 is formed as a metal fin protruding above the dielectric layer 135. In some embodiment, the bottom electrode 101 is formed by depositing a layer of metal or metal-containing material (e.g., Cu, W, TiN, TaN, or the like) over the dielectric layer 135, then patterning the deposited layer to form the metal fin, using, e.g., an anisotropic etching process. In the example of FIG. 3, the metal fin structure of the bottom electrode 101 has a width W between about 5 nm and about 15 nm, and a height H between about 10 nm and about 50 nm.

Once the metal fin structure is formed, the dielectric layer 103 is formed conformally over sidewalls and over an upper surface of the bottom electrode 101 (e.g., a metal fin), using a suitable deposition method such as ALD. A thickness of the dielectric layer 103 (e.g., $SiO_2$) is less than about 2 nm, such as about 1 nm. Next, the internal metal layer 105 is formed conformally over the dielectric layer 103 and extends along sidewalls and along an upper surface of the bottom electrode 101.

Note that due to the structure of the 3D MIM structure, the area $A_2$ of the internal metal layer 105 (or the area of the dielectric layer 103) includes areas along the sidewalls and along the upper surface of the bottom electrode 101. As a result, compared with the planar MIM structure of the second capacitor in the FTJ 102 of FIG. 1A, the FTJ 102B of FIG. 3 can achieve the same area $A_2$ for the internal metal layer 105 with a smaller footprint over the substrate 131. This allows a higher integration density for the device 300.

After the internal metal layer 105 is formed, the dielectric layer 117 is formed over the dielectric layer 135 and around the second capacitor (e.g., 101, 103, and 105). A planarization process, such as chemical mechanical planarization (CMP), may be performed to achieve a planar upper surface for the dielectric layer 117 and to expose the upper surface of the internal metal layer 105.

Next, the ferroelectric layer 107 and the top electrode 109 are formed successively over the internal metal layer 105, and a patterning process is performed to remove portions of the ferroelectric layer 107 and portions of the top electrode 109, similar to the processing for the device 100 of FIG. 1A. Next, a dielectric layer 118, which may be the same material as the dielectric layer 117, is formed over the dielectric layer 117. Depending on the materials of the dielectric layer 118 and/or the formation method, there may or may not be an interface 117F between the dielectric layers 118 and 117. Next, vias 11 and conductive lines 115 are formed to electrically couple to the top electrode 109 of the FTJ 102B. Note that in the example of FIG. 3, the bottom electrode 101 of the FTJ 102B is electrically coupled to, e.g., a drain of the transistor 133 by the via 137. The electrical connection between the transistor 133 and the FTJ 102B shown in FIG. 3 is merely an example, other electrical connections are also possible and are fully intended to be included within the scope of the present disclosure.

In the example of FIG. 3, the first capacitor of the FTJ 102B has a planar MFM structure, which includes the top electrode 109, the ferroelectric layer 107, and the horizontal portion of the internal metal layer 105 (e.g., the portion along the upper surface of the dielectric layer 103). The second capacitor of the FJT 102B has a three-dimensional MIM structure, which includes the internal metal layer 105, the dielectric layer 103, and the bottom electrode 101 (e.g., a metal fin). The FTJ 102B may be referred to as having a 3D MFMIM structure or as a 3D MFMIM FTJ.

Similar to the FTJ 102, the area $A_1$ of the top electrode 109 of the FTJ 102B is smaller than the area $A_2$ of the internal metal layer 105 of the FTJ 102B. In some embodiments, a ratio between the area $A_1$ of the top electrode 109 and the area $A_2$ of the internal metal layer 105 is between about 1/100 and about 1/5, such as about 1/30. Dimensions of other layers of the FTJ 102B are the same as or similar to those of the FTJ 102. For example, a thickness of the dielectric layer 103 in FIG. 3 is less than about 2 nm, such as 1 nm. A thickness of the ferroelectric layer 107 in FIG. 3 is between about 1 nm and about 3 nm, such as about 3 nm.

Figure 4:
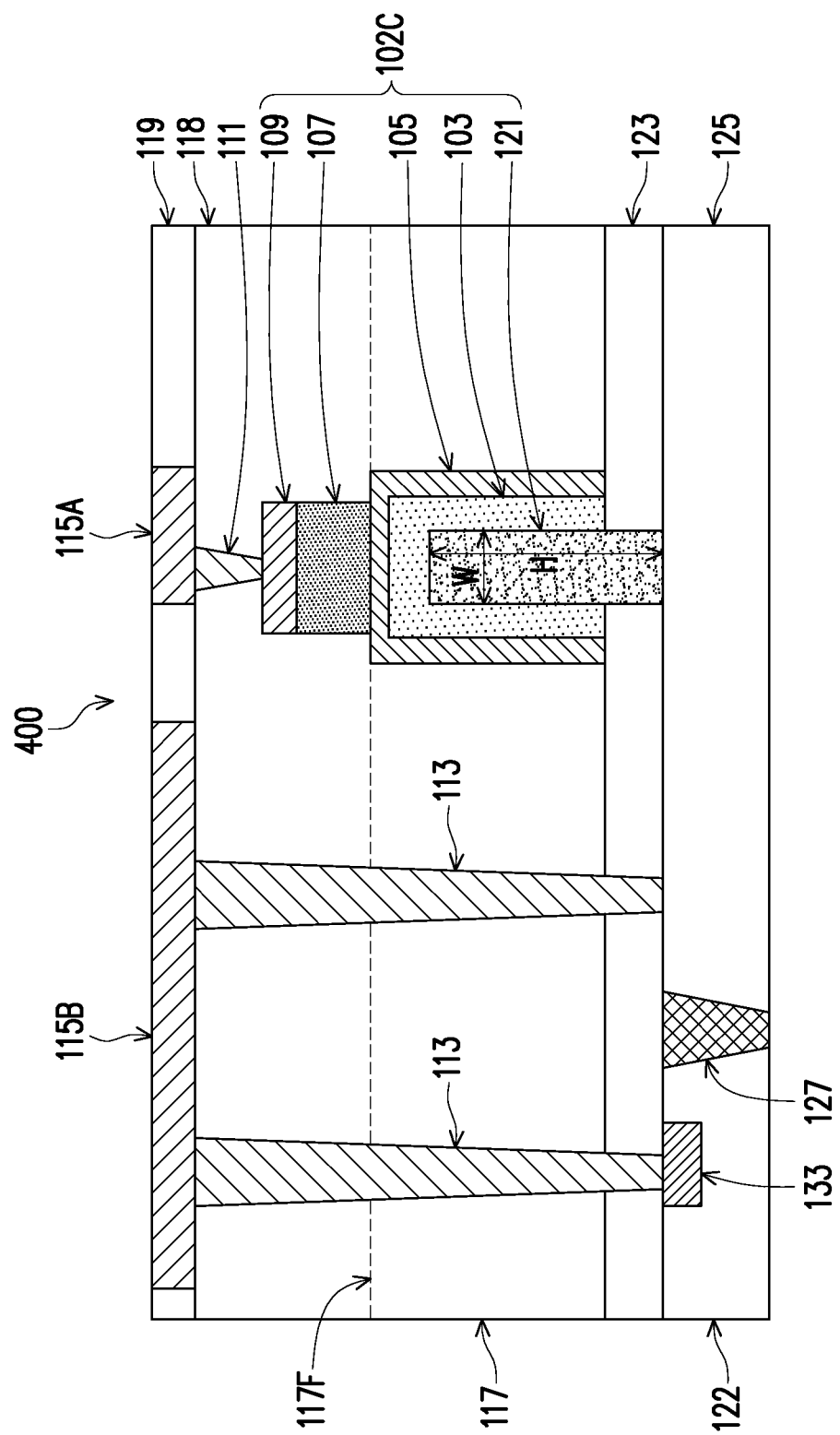
FIG. 4 illustrates a cross-sectional view of a device comprising an FTJ, in yet another embodiment.

FIG. 4 illustrates a cross-sectional view of a device 400 (e.g., a memory device) with an FTJ 102C, in an embodiment. The FTJ 102C is similar to the FTJ 102B, but the bottom electrode 121 of the FTJ 102C is a heavily doped substrate instead of a metal or a metal-containing material, which bottom electrode 121 has a fin structure protruding above a substrate 125. In the illustrated embodiment, the bottom electrode 121 is connected to the substrate 125, which is also a heavily doped substrate. In other words, the bottom electrode 121 and the substrate 125 in FIG. 4 are formed of a same heavily doped semiconductor material. In some embodiments, the fin structure of the bottom electrode 121 is formed by patterning the heavily doped semiconductor material using, e.g., an anisotropic etching process. The composition of the heavily doped semiconductor material (e.g., 121 and 125) is the same as or similar to that of the heavily doped substrate 121 of FIG. 2, thus details are not repeated here. A width W of the fin structure of the bottom electrode 121 is between about 5 nm and about 15 nm, and a height H of the fin structure of the bottom electrode 121 is between about 10 nm and about 50 nm, in some embodiments.

Referring to FIG. 4, after the bottom electrode 121 is formed, a dielectric layer 123 is formed over the substrate 125 and around the bottom electrode 121. The material and the formation method of the dielectric layer 123 may be the same as or similar to that of the dielectric layer 117, thus details are not repeated. In some embodiments, the dielectric layer 123 is omitted. Subsequent processing to form other layers of the FTJ 102C, the vias 111/113, the conductive lines 115A/115B, and the dielectric layers 117/118/119 are the same as or similar to those described above, thus details are not repeated here. The electrical connection between the transistor 133 and the FTJ 102C shown in FIG. 4 is merely an example, other electrical connections are also possible and are fully intended to be included within the scope of the present disclosure.

Note that the second capacitor of the FTJ 102C in FIG. 4, which includes the bottom electrode 121, the dielectric layer 103, and the internal metal layer 105, has a 3D MIS structure. The first capacitor of the FTJ 102C, which includes (the horizontal portion of) the internal metal layer 105, the ferroelectric layer 107, and the top electrode 109, has a planar MFM structure. The FTJ 102C may be referred to as having a 3D MFMIS structure or as a 3D MFMIS FTJ. Similar to the discussion above for the FTJ 102B, the 3D MIS structure of the second capacitor of the FTJ 102C allows for a large area $A_2$ (e.g., areas along sidewalls and a top surface of the bottom electrode 121) for the internal metal layer 105 with a small footprint over the substrate 125, which allows for higher integration density for the device 400.

Similar to the FTJ 102B, the area $A_1$ of the top electrode 109 of the FTJ 102C is smaller than the area $A_2$ of the internal metal layer 105 of the FTJ 102C. In some embodiments, a ratio between the area $A_1$ of the top electrode 109 and the area $A_2$ of the internal metal layer 105 is between about 1/100 and about 1/5, such as about 1/30. Dimensions of other layers of the FTJ 102C are the same as or similar to those of the FTJ 102. For example, a thickness of the dielectric layer 103 in FIG. 4 is less than about 2 nm, such as 1 nm. A thickness of the ferroelectric layer 107 in FIG. 4 is between about 1 nm and about 3 nm, such as about 3 nm.

Disclosed embodiments achieve advantages. For example, by having the internal metal layer 105 in the FTJ, and by designing the area $A_1$ of the top electrode 109 to be smaller than the area $A_2$ of the internal metal layer 105, only a small percentage of the voltage V applied at the two terminals of the FTJ is applied across the dielectric layer 103, which reduces the E-field in the dielectric layer 103 and reduces or avoids breakdown of the dielectric layer 103, thus improving the endurance of the FTJ. In addition, using high-K dielectric material for the dielectric layer 103 further reduces the E-field of the dielectric layer 103, and may further improve the endurance of the device formed. The disclosed 3D MFMIM FTJ or 3D MFMIS FTJ allows for higher integration density than the planar FTJs.

Figure 5:
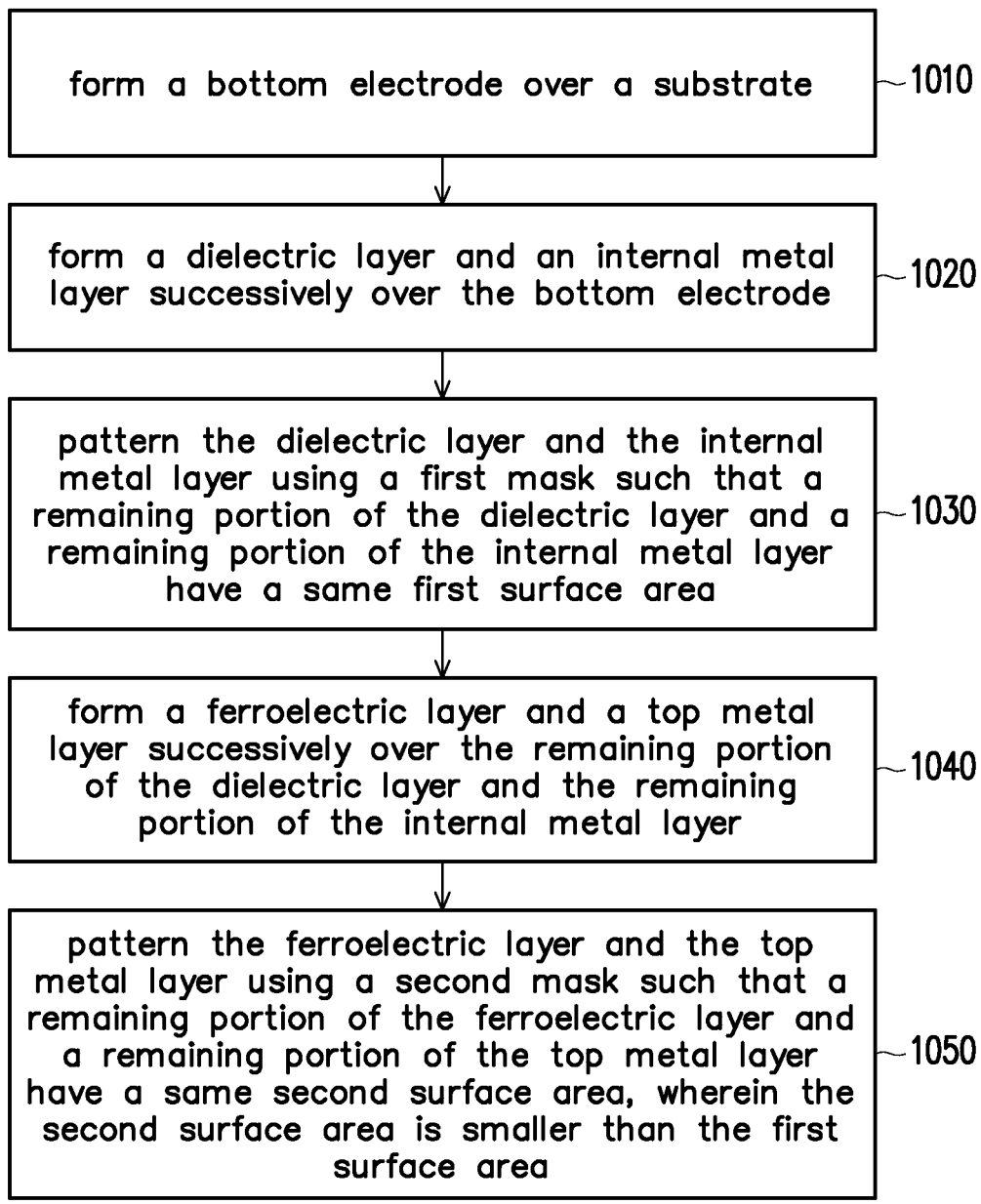
FIG. 5 illustrates a flow chart of a method of forming a device comprising an FTJ, in some embodiments.

FIG. 5 illustrates a flow chart of a method of fabricating a device, in accordance with some embodiments. It should be understood that the embodiment method shown in FIG. 5 is merely an example of many possible embodiment methods. One of ordinary skill in the art would recognize many variations, alternatives, and modifications. For example, various steps as illustrated in FIG. 5 may be added, removed, replaced, rearranged or repeated.

Referring to FIG. 5, at step 1010, a bottom electrode is formed over a substrate. At step 1020, a dielectric layer and an internal metal layer are formed successively over the bottom electrode. At step 1030, the dielectric layer and the internal metal layer are patterned using a first mask such that a remaining portion of the dielectric layer and a remaining portion of the internal metal layer have a same first surface area. At step 1040, a ferroelectric layer and a top metal layer are formed successively over the remaining portion of the dielectric layer and the remaining portion of the internal metal layer. At step 1050, the ferroelectric layer and the top metal layer are patterned using a second mask such that a remaining portion of the ferroelectric layer and a remaining portion of the top metal layer have a same second surface area, wherein the same second surface area is smaller than the same first surface area.

In accordance with an embodiment, a device includes a bottom electrode comprising a first electrically conducive material; a dielectric layer over the bottom electrode; an internal metal layer over the dielectric layer; a ferroelectric layer over the internal metal layer; and a top electrode over the ferroelectric layer, the top electrode comprising a second electrically conductive material, an area of the top electrode being smaller than an area of the internal metal layer. In an embodiment, an area of the top electrode is the same as an area of the ferroelectric layer. In an embodiment, an area of the internal metal layer is the same as an area of the dielectric layer. In an embodiment, wherein a ratio between the area of the top electrode and the area of the internal metal layer is between about 1:100 and about 1:5. In an embodiment, a dielectric constant of the dielectric layer is between about 3.9 and about 25. In an embodiment, the ferroelectric layer comprises a doped hafnium oxide. In an embodiment, the doped hafnium oxide comprise hafnium oxide doped by silicon, zirconium, aluminum, or lanthanum. In an embodiment, the first electrically conducive material is a heavily doped semiconductor material, and the second electrically conducive material is a metal. In an embodiment, the first electrically conducive material and the second electrically conducive material are metal. In an embodiment, the bottom electrode is a fin protruding above a substrate, wherein the dielectric layer and the internal metal layer extend conformally along sidewalls and a top surface of the fin, wherein the dielectric layer is interposed between the fin and the internal metal layer. In an embodiment, the fin is a metal fin. In an embodiment, the fin is a heavily doped semiconductor fin.

In accordance with an embodiment, a device includes a substrate; and a ferroelectric tunnel junction (FTJ) over the substrate, the FTJ comprising: a bottom electrode; a top electrode over the bottom electrode; a ferroelectric film between the bottom electrode and the top electrode, wherein the ferroelectric film and the top electrode have a same first surface area; an internal metal layer between the ferroelectric film and the bottom electrode; and a dielectric layer between the internal metal layer and the bottom electrode, wherein the dielectric layer and the internal metal layer have a same second surface area, wherein the same first surface area is smaller than the same second surface area. In an embodiment, the bottom electrode comprises a doped semiconductor material, and the top electrode comprises a metal. In an embodiment, the dielectric layer comprises a high-K dielectric material. In an embodiment, the bottom electrode is a fin protruding above the substrate, wherein the dielectric layer extends conformally along sidewalls and a top surface of the fin, and the internal metal layer extends conformally over the dielectric layer and along the top surface and the sidewalls of the fin.

In accordance with an embodiment, a method includes forming a bottom electrode over a substrate; forming a dielectric layer and an internal metal layer successively over the bottom electrode; patterning the dielectric layer and the internal metal layer using a first mask such that a remaining portion of the dielectric layer and a remaining portion of the internal metal layer have a same first surface area; forming a ferroelectric layer and a top metal layer successively over the remaining portion of the dielectric layer and the remaining portion of the internal metal layer; and patterning the ferroelectric layer and the top metal layer using a second mask such that a remaining portion of the ferroelectric layer and a remaining portion of the top metal layer have a same second surface area, wherein the same second surface area is smaller than the same first surface area. In an embodiment, forming the bottom electrode comprises forming a bottom metal layer over the substrate. In an embodiment, forming the bottom electrode comprises forming a heavily doped semiconductor material over the substrate. In an embodiment, forming the bottom electrode comprises forming a fin protruding above the substrate, wherein the dielectric layer and the internal metal layer are formed conformally along sidewalls and a top surface of the fin.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
a bottom electrode comprising a first electrically conducive material;
a dielectric layer over the bottom electrode;
an internal metal layer over the dielectric layer;
a ferroelectric layer over the internal metal layer; and
a top electrode over the ferroelectric layer, the top electrode comprising a second electrically conductive material, an area of the top electrode being smaller than an area of the internal metal layer.

2. The device of claim 1, wherein an area of the top electrode is the same as an area of the ferroelectric layer.

3. The device of claim 2, wherein an area of the internal metal layer is the same as an area of the dielectric layer.

4. The device of claim 3, wherein a ratio between the area of the top electrode and the area of the internal metal layer is between about 1:100 and about 1:5.

5. The device of claim 4, wherein a dielectric constant of the dielectric layer is between about 3.9 and about 25.

6. The device of claim 1, wherein the ferroelectric layer comprises a doped hafnium oxide.

7. The device of claim 6, wherein the doped hafnium oxide comprise hafnium oxide doped by silicon, zirconium, aluminum, or lanthanum.

8. The device of claim 1, wherein the first electrically conducive material is a heavily doped semiconductor material, and the second electrically conducive material is a metal.

9. The device of claim 1, wherein the first electrically conducive material and the second electrically conducive material are metal.

10. The device of claim 1, wherein the bottom electrode is a fin protruding above a substrate, wherein the dielectric layer and the internal metal layer extend conformally along sidewalls and a top surface of the fin, wherein the dielectric layer is interposed between the fin and the internal metal layer.

11. The device of claim 10, wherein the fin is a metal fin.

12. The device of claim 10, wherein the fin is a heavily doped semiconductor fin.

13. A device comprising:
a substrate; and
a ferroelectric tunnel junction (FTJ) over the substrate, the FTJ comprising:
a bottom electrode;
a top electrode over the bottom electrode;

a ferroelectric film between the bottom electrode and the top electrode, wherein the ferroelectric film and the top electrode have a same first surface area;

an internal metal layer between the ferroelectric film and the bottom electrode; and a dielectric layer between the internal metal layer and the bottom electrode, wherein the dielectric layer and the internal metal layer have a same second surface area, wherein the same first surface area is smaller than the same second surface area.

14. The device of claim 13, wherein the bottom electrode comprises a doped semiconductor material, and the top electrode comprises a metal.

15. The device of claim 14, wherein the dielectric layer comprises a high-K dielectric material.

16. The device of claim 14, wherein the bottom electrode is a fin protruding above the substrate, wherein the dielectric layer extends conformally along sidewalls and a top surface of the fin, and the internal metal layer extends conformally over the dielectric layer and along the top surface and the sidewalls of the fin.

17. A device comprising:
a bottom electrode over a substrate;
a dielectric layer and an internal metal layer that are disposed over the bottom electrode, wherein the dielectric layer is between the internal metal layer and the bottom electrode, wherein the dielectric layer and internal metal layer have a same first surface area; and
a ferroelectric layer and a top electrode that are disposed over the internal metal layer, wherein the ferroelectric layer is between the internal metal layer and the top electrode, wherein the ferroelectric layer and the top electrode have a same second surface area, wherein the same second surface area is smaller than the same first surface area.

18. The device of claim 17, wherein the bottom electrode is a metal layer.

19. The device of claim 17, wherein the bottom electrode is a doped semiconductor material.

20. The device of claim 17, wherein the bottom electrode is a fin protruding above the substrate, wherein the dielectric layer and the internal metal layer extend conformally along sidewalls and a top surface of the fin.

* * * * *